United States Patent
Tournois

(10) Patent No.: US 6,737,941 B1
(45) Date of Patent: May 18, 2004

(54) INTERFACE ACOUSTIC WAVES FILTER, ESPECIALLY FOR WIRELESS CONNECTIONS

(76) Inventor: Pierre Tournois, 45 rue Croulebarbe, 75013 Paris (FR)

( * ) Notice: Subject to any disclaimer, the term of this patent is extended or adjusted under 35 U.S.C. 154(b) by 0 days.

(21) Appl. No.: 10/110,403

(22) PCT Filed: Sep. 28, 2000

(86) PCT No.: PCT/FR00/02727
§ 371 (c)(1),
(2), (4) Date: Apr. 11, 2002

(87) PCT Pub. No.: WO01/29964
PCT Pub. Date: Apr. 26, 2001

(30) Foreign Application Priority Data

Oct. 15, 1999 (FR) .............................. 99 12992

(51) Int. Cl.[7] .................................. H03H 9/00
(52) U.S. Cl. ...................... 333/193; 333/186
(58) Field of Search ..................... 333/193–195, 333/186; 310/313 A, 313 B, 313 D, 313 R

(56) References Cited

U.S. PATENT DOCUMENTS 5,633,616 A * 5/1997 Goto ........................... 333/193
6,046,656 A * 4/2000 Mishima ..................... 333/141

FOREIGN PATENT DOCUMENTS

FR 2145750 * 1/1973 ............ H03H/9/00

* cited by examiner

Primary Examiner—Terry D. Cunningham
Assistant Examiner—Quan Tra
(74) Attorney, Agent, or Firm—William A. Drucker

(57) ABSTRACT

The inventive acoustic filter comprises two solid bodies (1, 2), at least one of which is piezoelectric. Said bodies are interconnected in such a way as to form a plane interface (3) between them, acoustic waves being generated by the piezoelectric body by means of an electrical field and being guided by the plane interface between the two solid bodies. The solid bodies are selected wish the objective of ensuring that the acoustic energy of said waves decreases exponentially in the two bodies in a perpendicular direction (Oy) to the interface, starting from the interface.

16 Claims, 2 Drawing Sheets

INTERFACE ACOUSTIC WAVES FILTER, ESPECIALLY FOR WIRELESS CONNECTIONS

BACKGROUND OF THE INVENTION

1. Field of the Invention

The present invention concerns a plane structure acoustic waves filter, that is in which acoustic waves spread inside a plane.

In particular, but not exclusively, it apples to wireless communication links like those used in mobile telephones or keys intended for the remote control for opening the doors of a motor vehicle, or even in the wireless exchange of data between delocalised computer or electric devices.

These wireless links use head filters, known as RF filters (Radio Frequency Filters) and FI intermediate frequency surface acoustic wave filters.

2. Description of the Prior Art

A surface acoustic wave filter is generally made up of a piezoelectric substrate which, under the effect of an electric field, generates acoustic waves which spread to the surface of the substrate, these waves being situated either inside the sagittal plane (Rayleigh waves) or orientated transversally (Bleustein-Gulayev waves) or quasi-transversally with respect to their propagation direction.

So as to generate these acoustic waves, the substrate includes a plane metal structure formed by a metal deposit laid on the substrate or imbedded in grooves formed on its surface, this plane metal structure including a plurality of fingers forming, for example, interdigitised combs, or forming an SPUDT type of transducer (Single Phase UniDirectional Transducer), a R-SPUDT type transducer (Resonant SPUDT) or acoustically or electrically coupled resonators. To obtain more information concerning these devices, reference can be made to the documents [4] to [8] mentioned in the list of references featured at the end of the present description and which are incorporated in the present description by way of reference.

The advantages of surface acoustic filters with respect to filters using another technique reside in their extremely small dimensions, low consumption (these are passive filters) and especially their cost of production.

However, the carrier frequencies used in mobile telephony are tending to increase from 900 MHz to 1800 MHz so as to reach 2200 MHz, indeed 3000 MHz and more. The size of the substrate, the gap between the fingers and in particular the size of the fingers of the metal structure thus need to be reduced accordingly so as to be able to process such high frequencies. Thus, the precision of lithography machines needed for carrying out metal etchings needs to change from 0.5 $\mu$m to 0.35 $\mu$m, indeed much less (0.25 to 0.18 $\mu$m).

Furthermore, the presence of the least amount of dust or projection of a material damages the performances of the filter, all the more so when the dimensions of the substrate need to be increasingly reduced.

Thus, it is essential for the substrate to be protected by a box.

In addition, as the substrate is piezoelectric, it also needs to be protected from electromagnetic perturbations. As a result, the box needs to be rendered immune from interference.

Thus, there is a structure problem due to the cost of components since by becoming smaller and smaller, the acoustic chips are going to be much cheaper than the box intended to protect the chip from the environment.

OBJECT OF THE INVENTION

The object of the present invention is to eliminate these drawbacks. To this effect, it offers a plane structure acoustic filter in which acoustic waves significantly spread inside a plane.

SUMMARY OF THE INVENTION

According to the invention, this filter is characterised in that it includes two solid bodies, one of these being piezoelectric, these bodies being linked to each other so as to have a plane interface between them, the acoustic waves being generated by the piezoelectric body with the aid of an electric field, the acoustic waves also being guided by the interface between, the two solid bodies and possessing an acoustic energy which decreases exponentially in the two bodies from the interface in a direction perpendicular to the interface.

By means of these arrangements, the acoustic waves spread, not to the surface of a substrate, but to the interface between two solid bodies. The energy of these waves decreases exponentially in the two solid bodies from the interface, although no energy goes outside the structure since the thickness of the solid bodies is greater than several ten times the wavelength of the acoustic waves. Accordingly, no box is required to protect the component (the filter) from its environment. Moreover, as the acoustic waves spread to the interface between two solid mediums, they can exhibit a speed of propagation greater than that of surface waves (for example 5000 m/s instead of 3000 m/s).

These interface waves, which are non-dispersive, can have two types of main polarisations: when the displacement vector of the atoms of the material is situated solely inside the sagittal plane (perpendicular to the interface plane), these are Stoneley waves, and when this displacement vector is situated solely along the direction perpendicular to the sagittal plane, these are Maerfel-Tournois transversal interface waves. A more detailed description of these waves can be seen in the documents [1], [2] and [3] mentioned at the end of the present description and which are integrated in the present description by way of reference.

Transversal or quasi-transversal waves are preferably used whose conditions of existence are less drastic than those of Stoneley waves and whose speed of propagation is generally greater.

Advantageously, the crystallographic axes of the materials constituting the two bodies are selected so that the transversal component of the displacement vector of the wave inside the plane of the interface is the only component of the displacement vector or is dominant and when the wave is coupled piezoelectrically.

One of the two bodies can to be made of a piezoelectric material or both. In the second case, the two piezoelectric materials can be identical. They can also be assembled so as to have the same crystalline orientations so as to form a single solid body. In this case, the plane metal structure forming the filter formed at the interface between the two bodies serves as a piezoelectric guide at the transversal interface wave (SH) or quasi-transversal interface wave (Q-SH).

When one of the materials is piezoelectric and the other not piezoelectric, the crystallographic axes of the piezoelectric material are preferably selected so that along the propagation direction the displacement vector of the acoustic waves is purely transversal-horizontal or has a dominant transversal-horizontal component and so that these waves are coupled piezoelectrically:

The crystallographic axes of the non-piezoelectric material can also be selected so that according to the selected direction of propagation, the displacement vector of the acoustic waves is purely transversal-horizontal or has a dominant transversal-horizontal component and so that these waves have a propagation speed equal to or greater than the speed of propagation of the transversal-horizontal or quasi-horizontal waves in the piezoelectric material.

According to one characteristic of the invention, the dielectric constant and the density of the non-piezoelectric material are respectively less than the dielectric constant and density of the piezoelectric material.

BRIEF DESCRIPTION OF THE DRAWINGS

One embodiment of the filter of the invention is described hereafter and given by way of non-restrictive example with reference to the accompanying drawings on in which.

DESCRIPTION OF THE PREFERRED EMBODIMENTS

Figure 1:
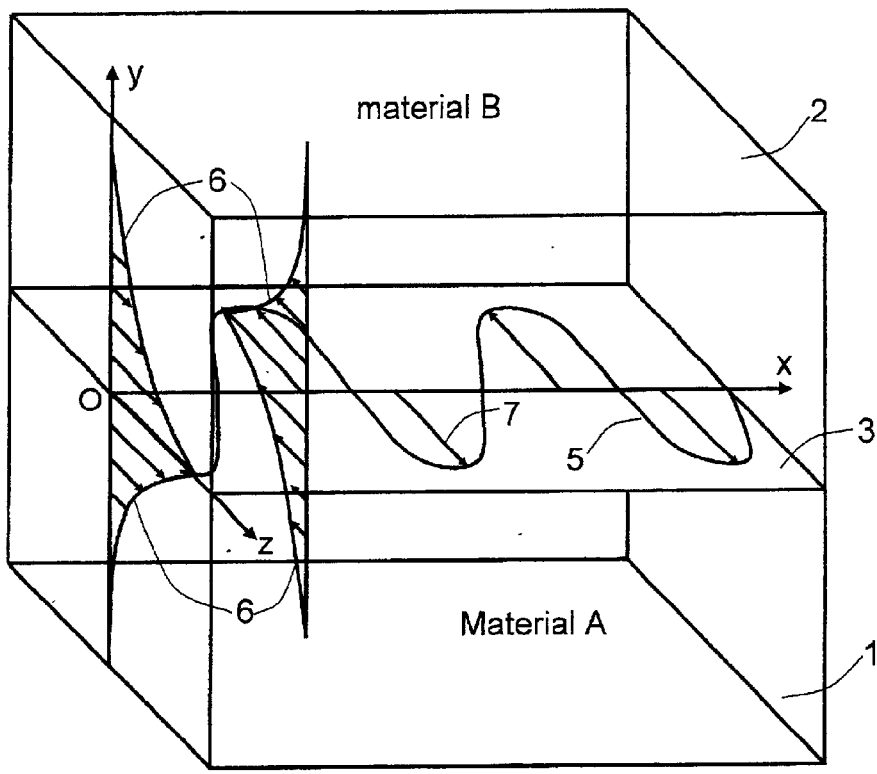
FIG. 1 diagrammatically represents in perspective a filter according to the invention showing the acoustic waves spreading to the interface between the two solid bodies.

FIG. 1 represents an acoustic waves filter according to the present invention. This filter includes two solid bodies 1, 2 having for example a parallelpiped shape and one face against the other so as to form an interface 3 situated inside a plane xOz. One 1 of the two solid bodies 1, 2 is made of a piezoelectric material A, whereas the other is a piezoelectric material B, possibly identical to the material A or not piezoelectric.

The crystallographic axes of the bodies 1 and 2 are selected so that if acoustic waves 5 are generated spreading in the direction Ox close to the interface plane 3, the energy of these waves decreases exponentially in the two bodies from the interface in a direction Oy perpendicular to the latter, as shown by the 35 exponential curves 6. Thus, no energy comes outside the structure if the bodies 1 and 2 are sufficiently thick (in the direction Oy on FIG. 1), namely about several ten times the wavelength of the acoustic waves.

Therefore, it is not necessary to provide a packaging to protect the component (the filter) from its environment.

These waves, which are non-dispersive, can have two types of main polarizations: when the displacement vector 7 of the atoms of the material is situated solely inside the sagittal plane xOy, these are Stoneley waves (see reference [1]); when this displacement vector is situated solely along the direction Oz perpendicular to the sagittal plane (case of the wave shown on FIG. 1), these are Maerfeld-Tournois transversal interface waves (see references [2] et [3]).

Preferably, the filter of the invention uses transversal interface waves whose conditions of existence are less drastic than those of Stoneley waves and whose speed of propagation is generally much greater.

Figure 2:
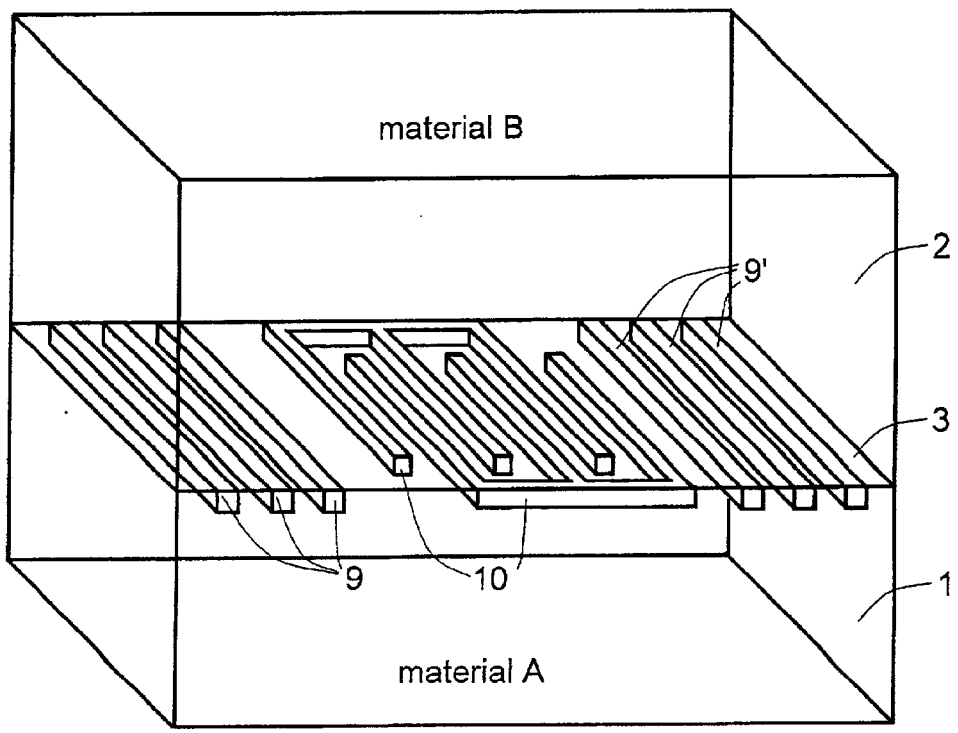
FIG. 2 diagrammatically represents in perspective a filter according to the invention including at the interface between the two solid bodies an interdigitised transducer.

On FIG. 2, the acoustic waves filter of the invention includes, placed at the interface 3 between the two materials A and B, a plane conductive filter structure, for example metallic, similar to that of the surface waves components, such as the interdigitised combs (see reference [4]), the SPUDT transducers (see reference [5]) or R-SPUDT transducers (see reference [6]), and the acoustically coupled wave resonators (see reference [7]) or those electrically coupled (see reference [8]). This conductive structure makes it possible to generate acoustic waves, the shape and arrangement of this structure defining the characteristics of the filter.

This structure may be constituted by a network of electric conductors obtained by a metal deposit formed at the interface between the two bodies 1, 2 embedded in grooves hollowed in one of the two bodies 1, 2 at the interface 3, for example in the body 1. It includes for example two reflectors constituted by conductor segments 9, 9' perpendicular to the direction of propagation of the acoustic waves and between the conductor segments 9 et 9', a transducer constituted by interdigitised combs 10 by having a plurality of fingers.

We are now going to for example examine successively in detail the cases where the two half-finished bodies 1, 2 are piezoelectric and where only one of the two bodies is piezoelectric.

The two Materials are Piezoelectric

When the two materials A and B are derived from the hexagonal crystallographic category with the axis C aligned along the axis Oz perpendicular to the sagittal plane, the speed $v_{CC}$ of these acoustic waves is given by:

$$\rho_A v_A^2 \left(1 - \frac{v_{CC}^2}{v_A^2}\right)^{1/2} + \rho_B v_B^2 \left(1 - \frac{v_{CC}^2}{v_B^2}\right)^{1/2} = \frac{e_A^2}{\varepsilon_A} + \frac{e_B^2}{\varepsilon_B} \quad (1)$$

When at the interface the piezoelectric charges are short-circuited by an extremely thin metal film.

On the other hand, when at the interface 3 the piezoelectric charges are not short-circuited, the speed $v_{NC}$ of these waves is given by:

$$\rho_A v_A^2 \left(1 - \frac{v_{NC}^2}{v_A^2}\right)^{1/2} + \rho_B v_B^2 \left(1 - \frac{v_{NC}^2}{v_B^2}\right)^{1/2} = \frac{\left(\frac{e_A}{\varepsilon_A} - \frac{e_B}{\varepsilon_B}\right)^2}{\frac{1}{\varepsilon_A} + \frac{1}{\varepsilon_B}} \quad (2)$$

In these equations (1) and (2), $\varepsilon_A$ and $\varepsilon_B$ are the dielectric constants of the materials A and B, $e_A$ and $e_B$ are the coefficients $(e_{15})_A$ and $(e_{15})_B$ of the piezoelectric tensors, and $V_A$ and $V_B$ are the transversal propagation speeds of these acoustic waves in the materials A and B.

If the two materials are identical and have the same orientation, $\rho_A = \rho_B = \rho$; $V_A = V_B = V_S$; $\varepsilon_A = \varepsilon_B = \varepsilon$; et $e_A = e_B = e_{15}$.

When at the interface the piezoelectric charges are short-circuited, the speed $v_{CC}$ of these waves is given by:

$$\left(1 - \frac{v_{CC}^2}{v_S^2}\right)^{1/2} = \frac{e_{15}^2}{\varepsilon \rho v_S^2} = \overline{K}^2 \quad (3)$$

$\overline{K}^2$ being the piezoelectric coupling coefficient of the material.

If on the other hand the piezoelectric charges at the interface are not short-circuited, the interface wave is degenerate and is merged with the transversal wave with speed volume $v_S$.

In this case, the interface wave exists and is not degenerate and its speed v is close to the speed $v_{CC}$.

The coupling coefficient $2\Delta v/v$ of this wave is then close to:

$$\frac{2\Delta v}{v} \cong \frac{v_S^2 - v_{CC}^2}{v_S^2} = \overline{K}^4 \quad (4)$$

So as to embody an interface acoustic filter in a single piezoelectric material, it is therefore necessary:

To select an orientation of the crystallographic axes of the piezoelectric crystal according to the selected direction of propagation Ox, the wave being purely transversal or whose transversal component of the displacement vector 7 being dominant, and so that this wave is piezoelectrically coupled, Cut the crystal along a plane parallel to the transversal component of the displacement vector 7 and to the direction of propagation of the wave, and Deposit or better still embed with the aid of the etched grooves with a thickness controlled by all the conventional methods relating to surface acoustic waves the plane filter structure with interdigitised, SPUDT, R-SPUDT combs or acoustically or electrically coupled resonators on the face obtained following cutting of one of the portions of the piezoelectric crystal which has been cut (FIG. 2), and Replace according to the crystalline orientations the second portion of the crystal which has been cut on the first by means of a molecular adhesion or any other elastic adherence element.

As regards the design of plane filters, this could be greatly simplified by noting that owing to the symmetry of its interface, the interface wave structure can be obtained via the mathematical superposition of two transversal surface wave half structures whose dielectric constants would be $\epsilon$ inside the piezoelectric body and $\epsilon_0 = 0$ outside the piezoelectric body.

By way of example for the pure transversal interface wave (SH), it is possible to take a piezoelectric material from the 6 mm hexagonal category whose crystallographic axis C is inside the plane of the interface perpendicular to the direction of propagation, such as lead titanate and zirconium (PZT).

For the quasi-transversal wave (Q-SH), it is possible to take cuts along the crystallographic axis Y (where Y is orientated by a certain angle, for example 175°) of lithium niobate (YX-LiNbO$_3$) or lithium tantalate (YX-LiTaO$_3$), the propagation being effected on the crystallographic axis X. It is also possible to take the cut ST from quartz, propagation being effected on the crystallographic axis X (ST-X quartz).

2-One of the Two Bodies is Piezoelectric and the Other Not

A purely transverse interface acoustic wave can exist between two materials where one is non-piezoelectric with a density $\rho_{NP}$ and speed $v_{NP}$, and the other is piezoelectric with a density $\rho_p$ and speed $v_p$, selected from the 6 mm crystalline category with the crystallographic axis C inside the plane xOz of the interface perpendicular to the direction of propagation Ox of the wave (FIG. 1).

The speed v of this wave is given by:

$$\left(1 - \frac{v^2}{v_P^2}\right)^{1/2} + \frac{\rho_{NP}}{\rho_P} \cdot \left(\frac{v_{NP}}{v_P}\right)^2 \cdot \left(1 - \frac{v^2}{v_{NP}^2}\right)^{1/2} = \eta^2 \quad (5)$$

$\eta^2$ being an effective piezoelectric coupling coefficient given by:

$$\eta^2 = \overline{K}^2 = \frac{e^2}{\varepsilon_P \rho_P v_P^2} \quad (6)$$

when at the interface the piezoelectric charges are short-circuited by an extremely thin metal film or by a non-piezoelectric conductor material, and by:

$$\eta^2 = \frac{\overline{K}^2}{\left(1 + \frac{\varepsilon_P}{\varepsilon_{NP}}\right)} \quad (7)$$

when at the interface the piezoelectric charges are not short-circuited.

In these equations, $\epsilon_p$ and $\epsilon_{NP}$ are respectively dielectric constants of the piezoelectric body and of the non-piezoelectric body, $e = e_{15}$ is a coefficient of the piezoelectric tensor and $\overline{K}^2$ is the piezoelectric coupling coefficient. So as to determine the conditions of existence of these interface waves, we examine the three terms of the equation (5). These terms need to be real and positive, the speed v is thus less than or at the most equal to the smallest of the speeds $v_p$ and $V_{NP}$. If v is equal to $V_{NP} \leq V_P$, the second term is cancelled and when v decreases, the first two terms increase. $\eta^2$ thus needs to be greater than the first term when $v = V_{NP}$.

If the speed v is equal to $v_P \leq V_{NP}$, the first term is cancelled and when v decreases, the first two terms increase. $\eta^2$ thus needs to also be greater than the second term when $v = v_P$.

The conditions of existence are therefore given by the pair of the following inequalities:

$$\left(1 - \frac{v_{NP}^2}{v_P^2}\right)^{1/2} \leq \eta^2 \text{ pour} \frac{v_{NP}}{v_P} \leq \quad (8)$$

$$1 \frac{\rho_{NP}}{\rho_P} \cdot \left(\frac{v_{NP}}{v_P}\right)^2 \cdot \left(1 - \frac{v_P^2}{v_{NP}^2}\right)^{1/2} \leq \eta^2 \text{ pour} \frac{v_{NP}}{v_P} \geq 1$$

Figure 3:
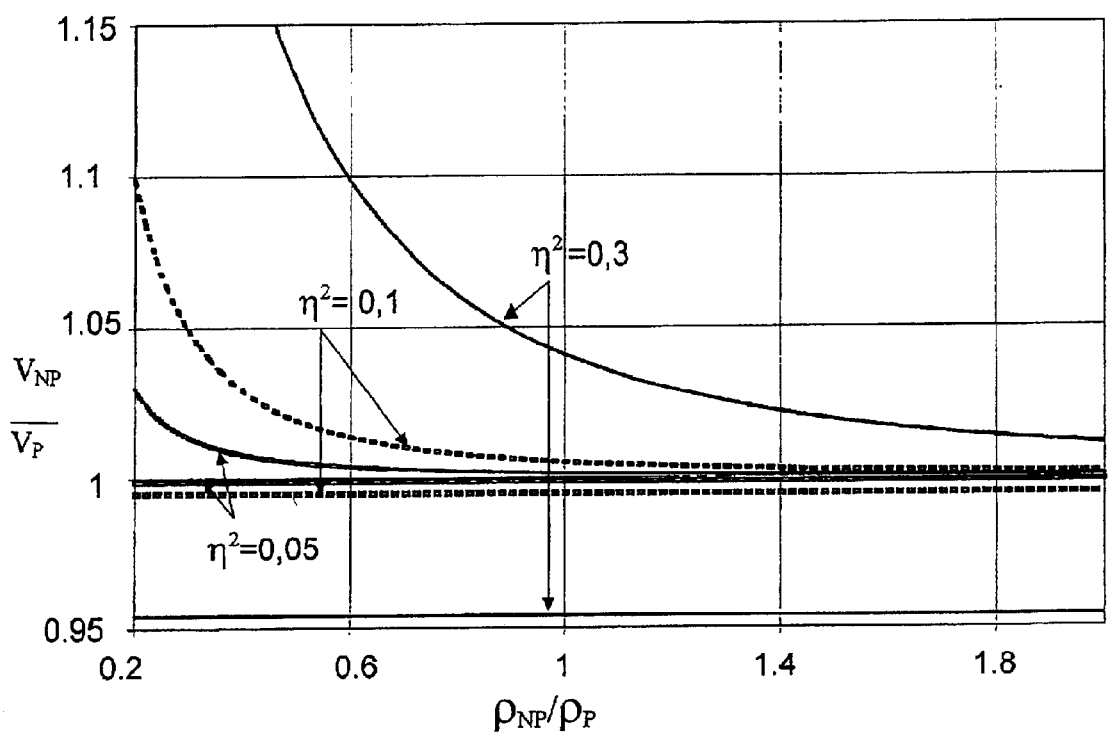
FIG. 3 shows two curves delimiting the range of existence of the transversal or quasi-transversal interface waves.

On FIG. 3, for various values of $\eta^2$ (0,05 ; 0,1 et 0,3) the two curves $V_{NP}/v_P$ have been plotted according to $\rho_{NP}/\rho_P$ which delimit the field of existence of these waves, as defined by the inequalities (8). It can be observed here that these waves still exist regardless of $\rho_{NP}/\rho_P$ when $v_{NP} = v_P = v_S$. In these circumstances, their speed v is given by:

$$\left(\frac{1 - v^2}{v_S^2}\right)^{1/2} = \frac{\eta^2}{\left(1 + \frac{\rho_{NP}}{\rho_P}\right)} \quad (9)$$

It may also be observed here that the smaller $\rho_{NP}$ is in relation to $\rho_P$, the more the field of existence widens at speeds $v_{NP}$ greater than $v_P$. Moreover, the larger $\eta^2$ will be and the smaller $\rho_{NP}$ will be in relation to $\rho_P$, the more the waves shall be localised close to the interface.

The coupling coefficient $2\Delta v/v$ of these waves can be easily calculated from the speed $v_{CC}$ when the interface is short-circuited or from the speed $v_{NC}$ when the interface is not short-circuited. When $v_{NP} = v_P = v_S$, there is the following:

$$\frac{2\Delta v}{v} \cong \frac{v_{NC}^2 - v_{CC}^2}{v_S^2} = \frac{\overline{K}^4}{\left(1 + \frac{\rho_{NP}}{\rho_P}\right)^2} \left[1 - \frac{1}{\left(1 + \frac{\varepsilon_P}{\varepsilon_{NP}}\right)^2}\right] \quad (10)$$

The coupling coefficient shall thus be much greater when $\overline{K}^2$ is large, when $\rho_{NP}$ shall be less than $\rho_P$ and when $\epsilon_{NP}$ is less than $\epsilon_P$.

So as to aid in selecting material pairings able to spread these transversal 10 interface waves, details are shown in table 1 according to the transversal speed v of a certain number of materials and their density ρ and relative dielectric constant ε.

TABLE 1

| | Materials | V (m/s) | ρ (kg/m3) | ε |
|---|---|---|---|---|
| 1 | AlN | 6300 | 3050 | ? |
| 2 | $Li_2B_4O_7$ | 3000–4450 | 2600 | ? |
| 3 | $LiNbO_3$ | 3500–4850 | 4700 | 44 |
| 4 | $LiTaO_3$ | 3350–4400 | 7450 | 41 |
| 5 | Quartz | 3100–3900 | 2651 | 4.5 |
| 6 | ZnO | 2800 | 5680 | 8.55 |
| 7 | PZT | 2450 | 7500 | 1700 |
| 8 | $Bi_{12}GeO_{20}$ | 1800 | 9200 | ? |
| 9 | $Al_2O_3$ | 6200 | 4000 | 9.34 |
| 10 | Si | 5450 | 2332 | 11.7 |
| 11 | YAG | 5100 | 4550 | ? |
| 12 | $SiO_2$ | 3900 | 2050 | 3.78 |

In this table, the materials 1 to 8 are piezoelectric and the materials 9 to 12 non-piezoelectric.

So as to embody an acoustic filter at the interface between a piezoelectric material and a non-piezoelectric material, it is thus necessary:

to select an orientation of the crystallographic axes of the piezoelectric crystal so that along the selected direction of propagation the wave is purely transversal or for which the transversal component of the displacement vector 7 is dominant and so that this wave is piezoelectrically coupled, select an orientation of the crystallographic axes of the non-piezoelectric crystal so that along the direction of the selected direction of propagation the wave is purely transversal or for which the transversal component of the displacement vector 7 is dominant and so that this wave has a propagation speed equal to or greater than the speed of the transversal or quasi-transversal waves in the piezoelectric body, select if possible a non-piezoelectric crystal with a density lower than that of the piezoelectric crystal, and select if possible a non-piezoelectric crystal with a dielectric constant less than that of the piezoelectric crystal.

So as to satisfy the conditions of existence of quasi-transversal interface waves, (Q-SH), the crystals are orientated slightly with respect to one another around an axis perpendicular to their interface from the described crystalline orientations.

According to one characteristic of the invention, on the surface of one of the materials, the metal structure of the plane filter is deposited or embedded in etched grooves having a controlled thickness along suitable axes, as shown on FIG. 2. Then the other material is adhered to this surface along the suitable axes by using any method suitable for elastic adherence.

By way of example, it is possible to adhere a YAG non-piezoelectric crystal on a piezoelectric lithium niobate crystal ($LiNbO_3$) or on a piezoelectric lithium tantalate crystal ($LiTaO_3$) cut along the crystallographic axis Y, propagation being effected along the crystallographic axis X.

According to another variant of the filter of the invention, one of the two bodies 1, 2 is crystalline and the other is obtained by a deposit or by epitaxial growth. In these circumstances, on the surface of the crystalline material, deposited or embedded in etched grooves having a controlled thickness along suitable axes is the metal structure which composes the plane filter and the second material is deposited or formed by epitaxial growth along the suitable axes on the prepared surface of the crystalline material.

Thus, it is possible to deposit non-piezoelectric amorphous silicon (Si) on a duly prepared surface of piezoelectric lithium niobate YX-$LiNbO_3$ with a cut Y (where Y is orientated by a certain angle), propagation being effected along the axis X. It is also possible to form by epitaxial growth a piezoelectric film of aluminium nitride (AlN) on a non-piezoelectric sapphire surface ($Al_2O_3$).

LIST OF REFERENCES MENTIONED IN THE DESCRIPTION

[1] R. Stoneley, Proc. Roy. Soc. (London) A 106, 416 (1924)
[2] C. Maerfeld and P. Tournois, Appl. Phys. Lett. 19, 117 (1971)
[3] B. Auld, Acoustic Fields and Waves in Solids, vol. 2, pages 145–151, John Wiley, New York (1973)
[4] D. P. Morgan, Surface Wave Devices for Signal Processing, Elsevier, N.Y. (1985)
[5] C. S. Hartmann, P. V. Wright, R. J. Kansy and E. M. Garber, An Analysis of SAW Interdigital Transducers with Internal Reflections and the Application to the Design of Single Phase Unidirectional Transducers, IEEE Ultrasonic Symp. Proc., p. 40–45 (1982)
[6] P. Ventura, M. Solal, P. Dufilue, J. M. Hodé and F. Roux, A New Concept in SPUDT design: the RSPUDT (Resonant SPUDT), IEEE Ultrasonic Symp. Proc., p. 1–6 (1994)
[7] L. A. Coldren, R. L. Rosenberg and J. A. Rentschler, Monolithic Transversally Coupled Saw Resonator Filters, IEEE Ultrasonic Symp. Proc., p. 888–893 (1977)
[8] P. F. Cross, R. F. Smith and W. H. Haydl, Electronic Letters, vol. 11, p. 244–245 (May 1975)

What is claimed is:

1. Plane structure acoustic filter comprising
   a first acoustic piezoelectric solid body linked to a second body so as to have a plane interface between them, in which acoustic waves are generated and guided, said waves being generated by said first acoustic piezoelectric solid body under effect of an electric field, said first and second bodies being made of materials selected so that said acoustic waves have an acoustic energy which decreases exponentially in said bodies from the interface in a direction perpendicular to the interface so as to avoid using of a protecting box.

2. Acoustic filter according to claim 1, wherein
   said acoustic waves are coupled piezolelectrically and have a displacement vector comprising a single component which is transversal inside the plane of said interface.

3. Plane structure acoustic filter comprising two solid bodies made of a same piezoelectric material and having a same crystalline orientations so as to form a single solid body these bodies being linked to each other so as to have between them a plane interface in which acoustic waves are guided, said waves being generated by one of said solid bodies under the effect of an electric field, wherein a plane metal structure is provided inside said single body so as to form a filtering means serving as a piezoelectric guide for the transversal or quasi-transversal interface acoustic waves.

4. Acoustic filter according to claim 3, wherein the material constituting the two solid bodies has crystallographic axes which are selected so that the transversal component of a displacement vector of the acoustic waves inside the plane of the interface is the sole component of said displacement vector, the material being piezoelectric in the 6 mm hexagonal category having a crystallographic axis C which is inside the plane of the said interface perpendicular to the direction of propagation of the acoustic waves.

5. Acoustic filter according to claim 3, wherein the crystallographic axes of the material constituting the two bodies has a crystallographic axis X and a crystallographic axis Y, said crystallographic axes being selected so that a transversal component of a displacement vector of the acoustic waves inside the plane of the said interface is dominant, the two bodies being obtained by making a cut in said material along the crystallographic axis Y, in a material consisting of lithium niobate or lithium tantalate, the acoustic waves spreading along the crystallographic axis X of the material.

6. Acoustic filter according to claim 3, wherein
the material constituting the said bodies consists of quartz having a crystallographic axis X and a crystallographic axis ST, said crystallographic axes being selected so that a transversal component of the displacement vector of the acoustic waves inside the plane of the interface is dominant, the two bodies being obtained by making cuts in said material along the crystallographic axis ST of the quartz, the acoustic waves spreading along the crystallographic axis X of the material.

7. Acoustic filter according to claim 3, obtained from a sole piezoelectric crystal which has been cut along a plane containing the propagation axis of the acoustic waves and the axis of the sole transverse or dominant displacement vector of the selected transversal or quasi-transversal interface acoustic waves, the surface obtained by the cut of one of the portions of the cut crystal including etched grooves with a controlled thickness in which a plane metal filter structure is formed, the two cut portions being replaced by each other along the same crystalline orientations and fixed to each other by an elastic adherence element.

8. Plane structure acoustic filter comprising two solid bodies made of the same piezoelectric material and having the same crystalline orientations so as to form a single solid body these bodies being linked to each other so as to have between them a plane interface in which acoustic waves are guided, said waves being generated by one of said solid body under the effect of an electric field,
wherein one of the bodies is piezoelectric and the other is non-piezoelectric, the materials constituting the bodies being selected so that the speed of propagation of the transversal or quasi-transversal acoustic waves inside a plane parallel to the interface plane in the non-piezoelectric material is equal to or greater than that in the piezoelectric material.

9. Acoustic filter according to claim 8, wherein the dielectric constant and density of the non-piezoelectric material are less than the dielectric constant and density of the piezoelectric material.

10. Acoustic filter according to claim 8, wherein so as to satisfy the conditions of existence of the interface acoustic waves for which the transversal component of the displacement vector inside the plane of the interface is dominant, the crystal of one of the two bodies is orientated slightly with respect to the other around an axis perpendicular the plane of their interface from the crystalline orientations required so that the piezoelectric waves are purely transversal at the interface between the two bodies.

11. Acoustic filter according to claim 8, wherein the two bodies are obtained from the cut of two crystalline materials along suitable crystallographic axes, the surface of one of the materials forming said interface including a plane metal filter structure, the two bodies being fixed to each other along suitable axes by means of an elastic adherence method.

12. Acoustic filter according to claim 8, wherein the non-piezoelectric body is a YAG crystal, whereas the piezoelectric body is a lithium niobate crystal or a lithium tantalate crystal, with a cut along the crystallographic axis Y, propagation being effected along the crystallographic axis X, the two bodies being fixed to each other along the suitable axes by means of any elastic adherence method.

13. Acoustic filter according to claim 8, which is formed by a crystalline material having a surface including a plane metallic filter structure, the other body being formed on this surface by a deposit or epitaxial growth along the suitable axes.

14. Acoustic filter according to claim 13, which is embodied by a deposit of amorphous silicon on a surface of lithium niobate with a cut along the crystallographic axis Y where Y is orientated by a certain angle, propagation of the acoustic waves being effected along the crystallographic axis X.

15. Acoustic filter according to claim 13, which is embodied by an epitaxial growth of a film of aluminium nitride on a sapphire surface.

16. Acoustic filter according to claim 1, wherein said acoustic waves are coupled piezolelectrically and have a displacement vector comprising a dominant component which is transversal inside the plane of said interface.

* * * * *